(12) United States Patent
Weis et al.

(10) Patent No.: US 7,794,614 B2
(45) Date of Patent: Sep. 14, 2010

(54) METHODS FOR GENERATING SUBLITHOGRAPHIC STRUCTURES

(75) Inventors: Rolf Weis, Dresden (DE); Christoph Noelscher, Nuremberg (DE)

(73) Assignee: Qimonda AG, Munich (DE)

( * ) Notice: Subject to any disclaimer, the term of this patent is extended or adjusted under 35 U.S.C. 154(b) by 230 days.

(21) Appl. No.: 11/754,813

(22) Filed: May 29, 2007

(65) Prior Publication Data
US 2008/0296737 A1    Dec. 4, 2008

(51) Int. Cl.
*H01L 21/302* (2006.01)
(52) U.S. Cl. .............................. 216/41; 216/46; 216/62; 216/87; 438/696; 438/705; 438/942; 438/947
(58) Field of Classification Search ............... 216/46
See application file for complete search history.

(56) References Cited

U.S. PATENT DOCUMENTS

| | | | |
|---|---|---|---|
| 4,144,101 A | 3/1979 | Rideout | |
| 4,808,545 A * | 2/1989 | Balasubramanyam et al. | 438/183 |
| 5,017,515 A | 5/1991 | Gill | |
| 5,795,830 A | 8/1998 | Cronin et al. | |
| 5,893,748 A | 4/1999 | Lin | |
| 5,916,821 A * | 6/1999 | Kerber | 438/696 |
| 6,010,953 A | 1/2000 | Prall | |
| 6,362,057 B1 * | 3/2002 | Taylor et al. | 438/286 |
| 6,362,117 B1 | 3/2002 | Houston | |
| 6,746,936 B1 * | 6/2004 | Lee | 438/445 |
| 6,887,395 B2 * | 5/2005 | Hareland et al. | 216/46 |
| 7,247,247 B2 * | 7/2007 | Hsieh et al. | 216/2 |
| 7,396,475 B2 * | 7/2008 | Sreenivasan | 216/2 |
| 7,455,956 B2 * | 11/2008 | Sandhu et al. | 430/313 |
| 7,696,076 B2 * | 4/2010 | Jung et al. | 438/593 |
| 2004/0002203 A1 | 1/2004 | Deshpande et al. | |
| 2006/0068596 A1 | 3/2006 | Dobuzinsky et al. | |
| 2007/0045748 A1 | 3/2007 | Booth, Jr. et al. | |
| 2007/0049030 A1 | 3/2007 | Sandhu et al. | |

FOREIGN PATENT DOCUMENTS

EP    0 240 683 A1    10/1987

* cited by examiner

*Primary Examiner*—Anita K Alanko
(74) *Attorney, Agent, or Firm*—Slater & Matsil, L.L.P.

(57) ABSTRACT

One possible embodiment is a method of manufacturing a structure on or in a substrate with the following steps
  a) positioning at least one spacer structure by a spacer technique on the substrate,
  b) using at least one of the groups of the spacer structure and a structure generated by the spacer structure as a mask for a subsequent particle irradiation step for generating a latent image in the substrate
  c) using the latent image for further processing the substrate.

23 Claims, 18 Drawing Sheets

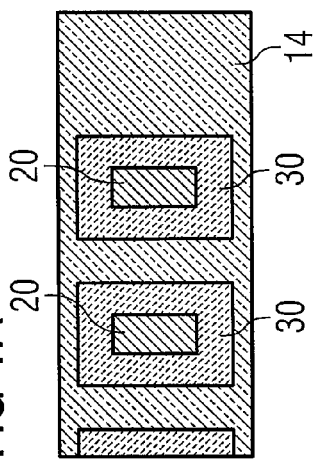
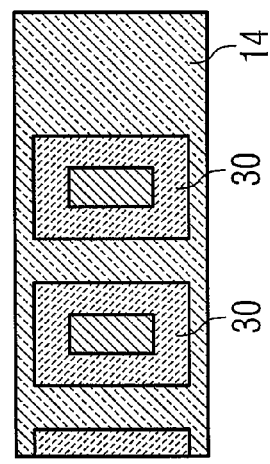
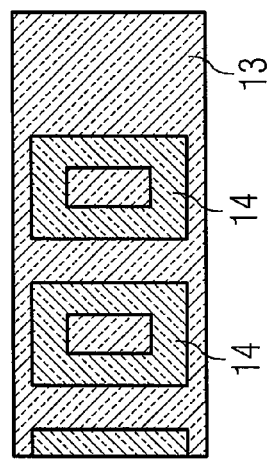
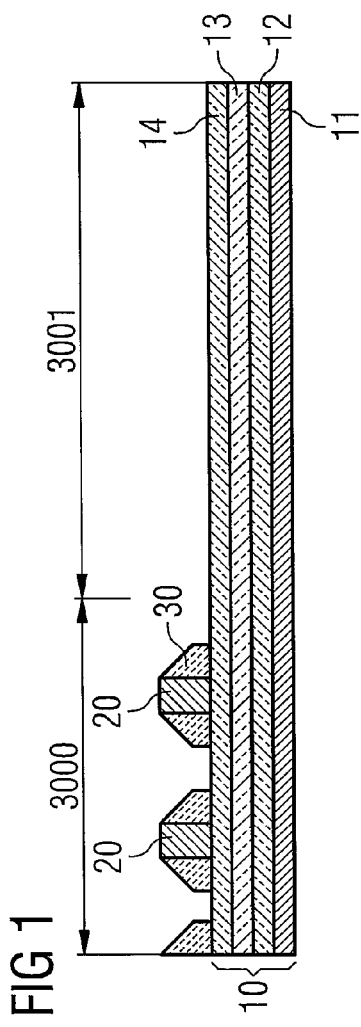
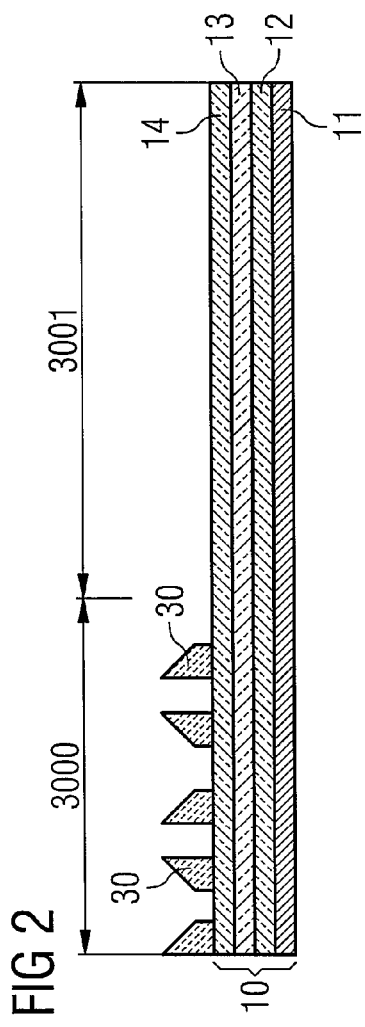
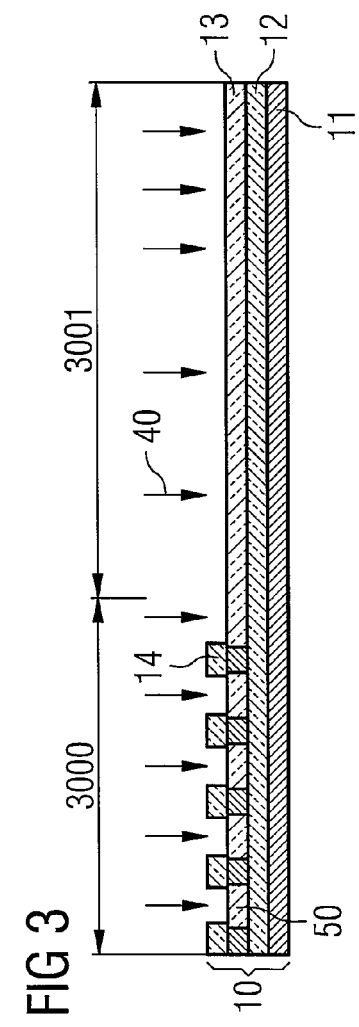

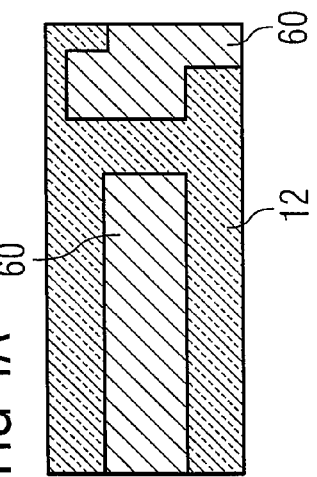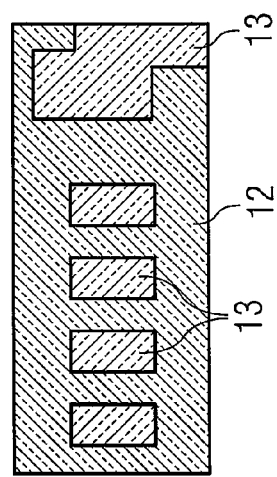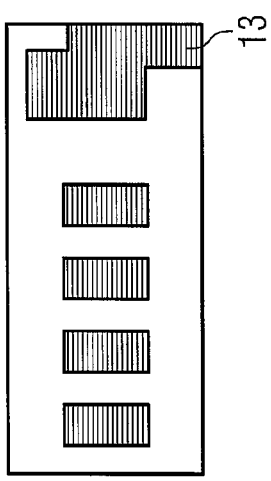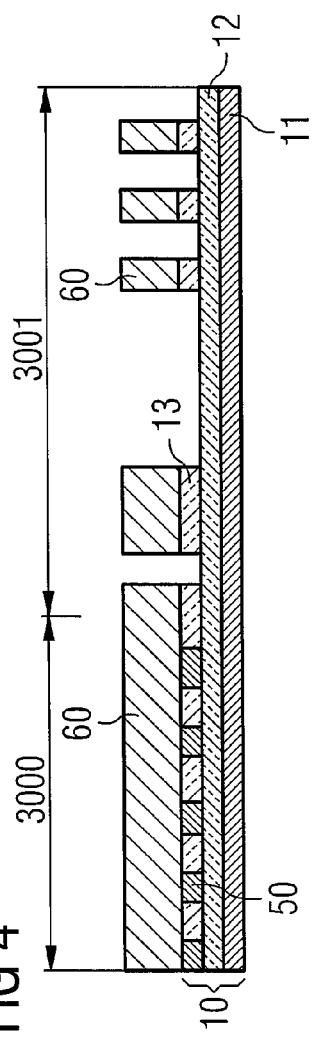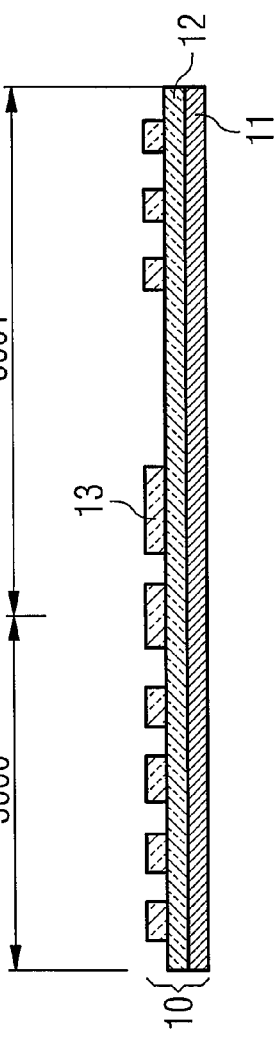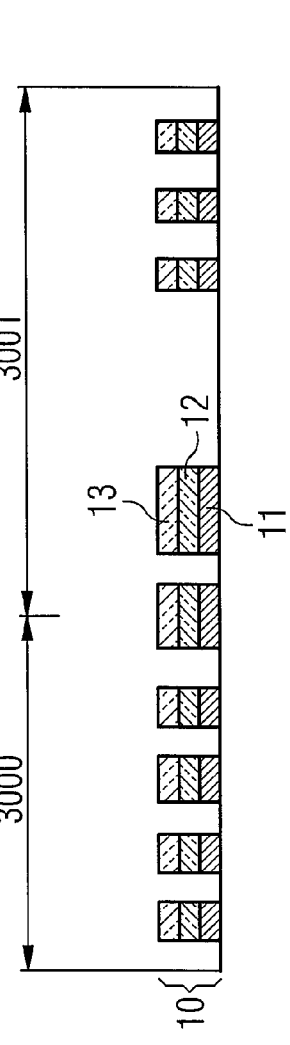

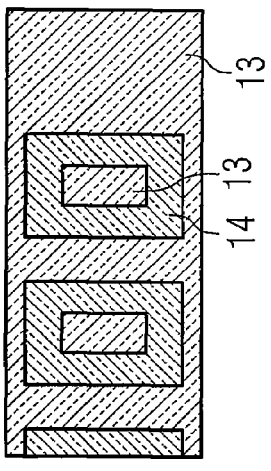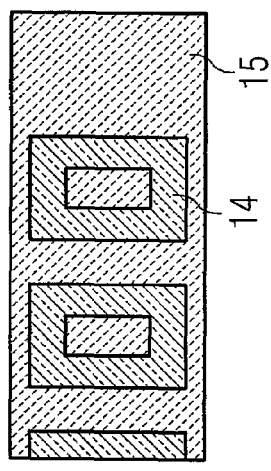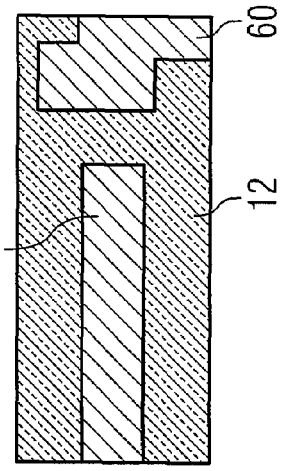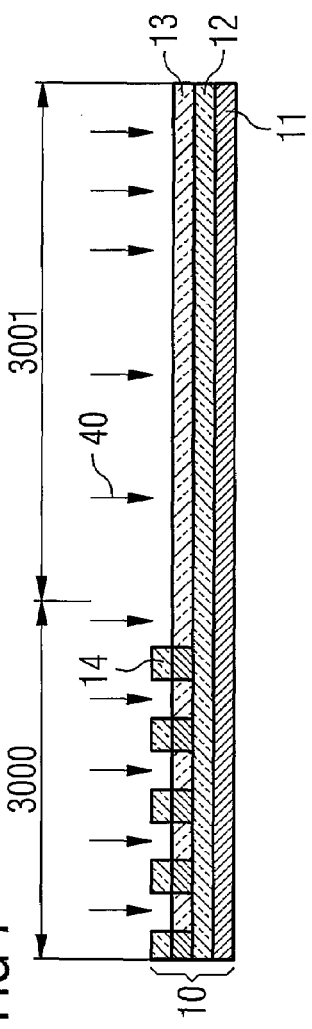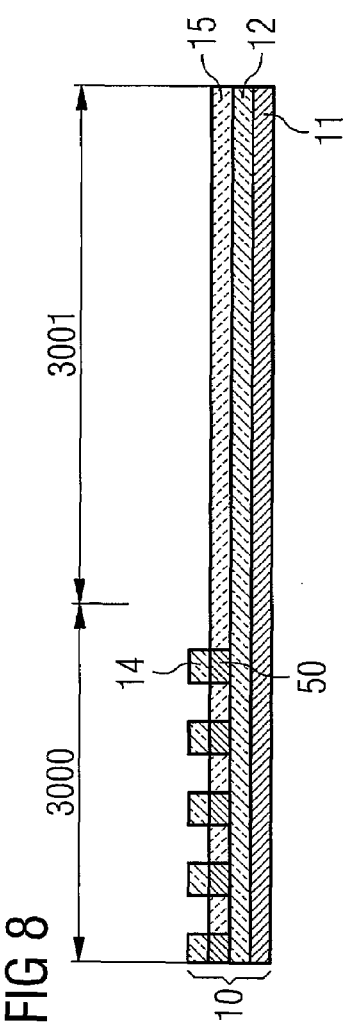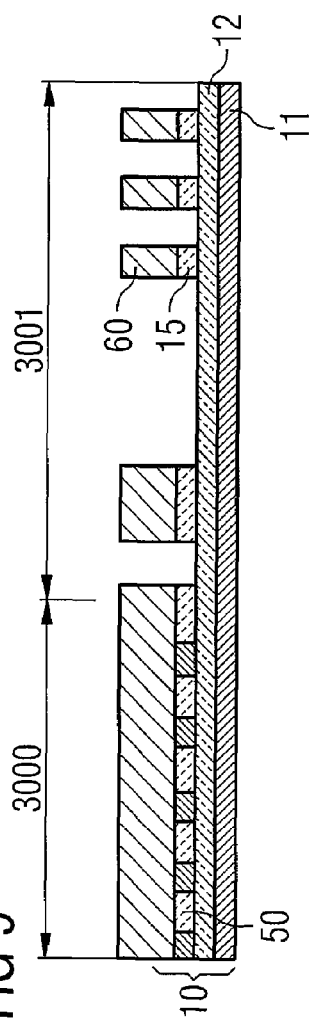

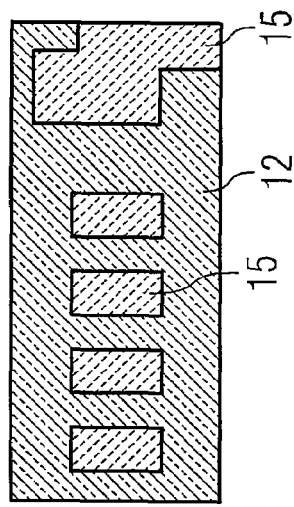
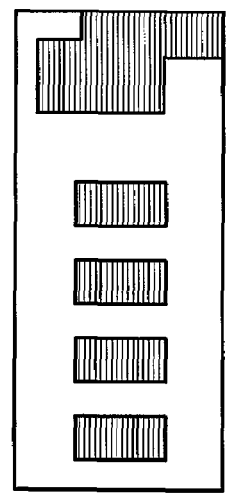
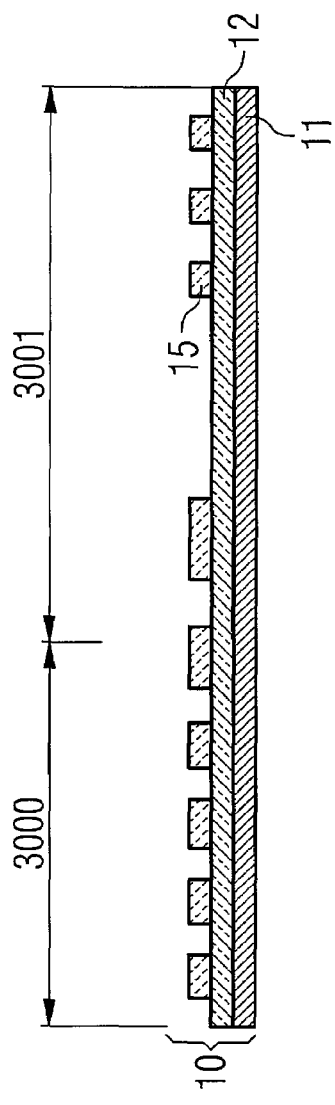
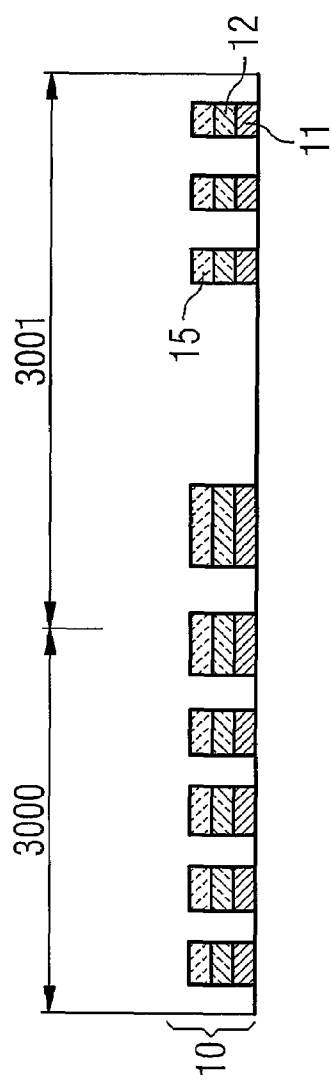

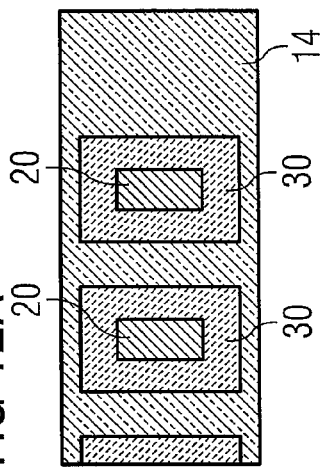
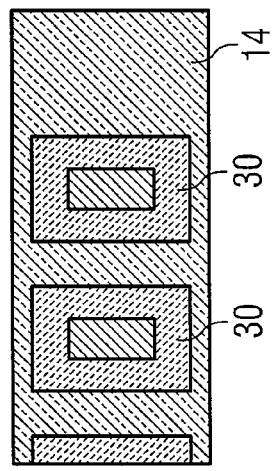
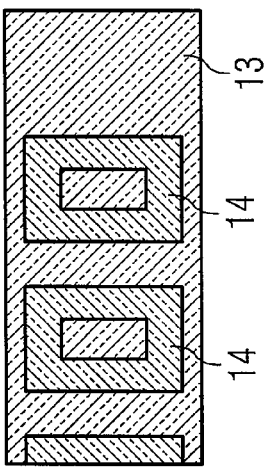
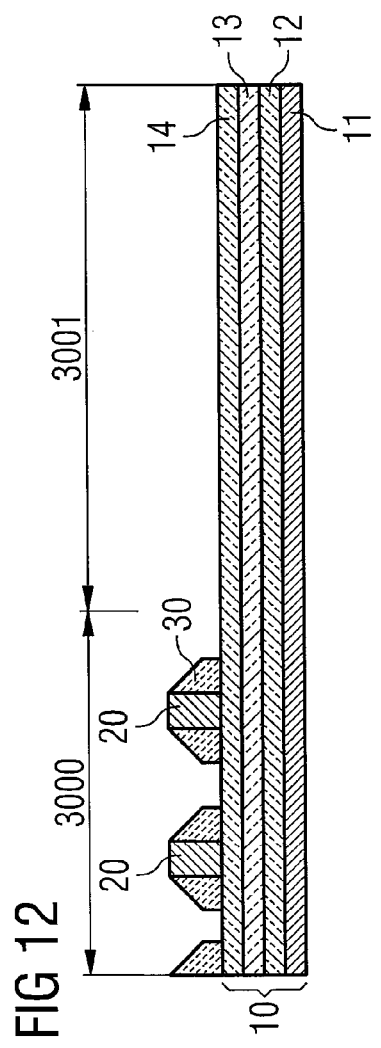
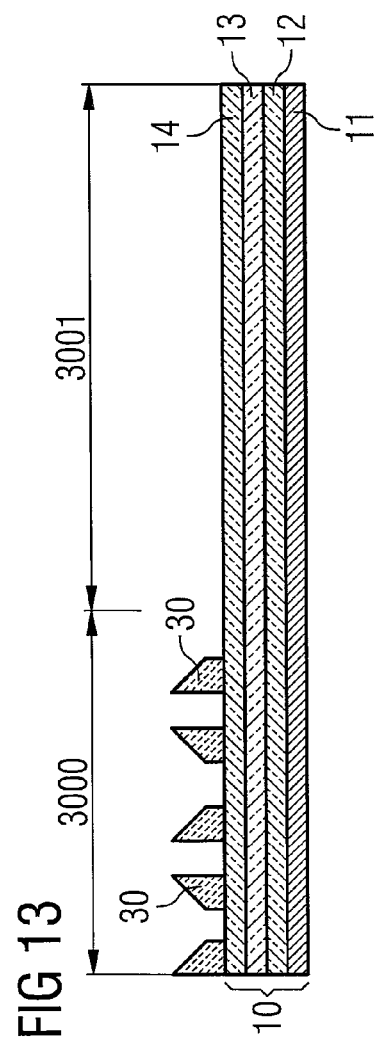
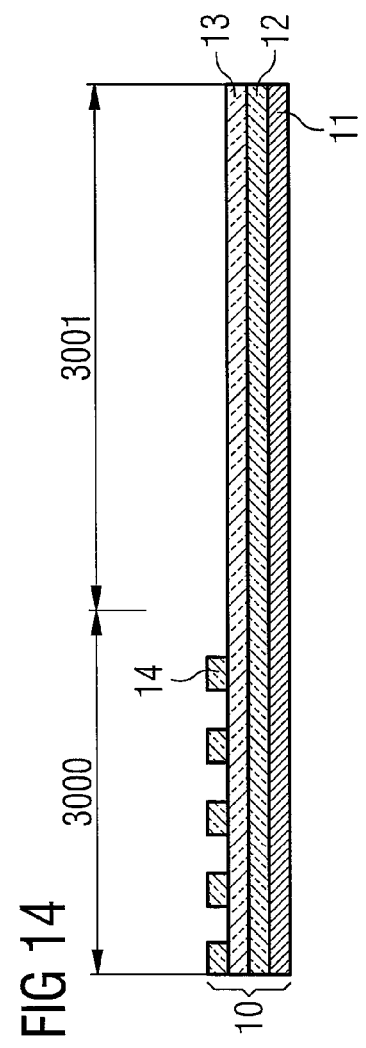

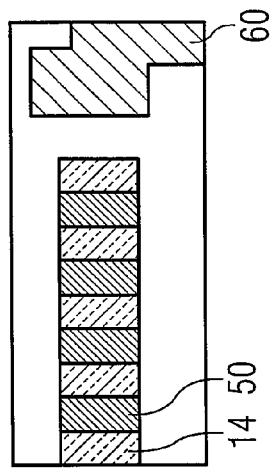
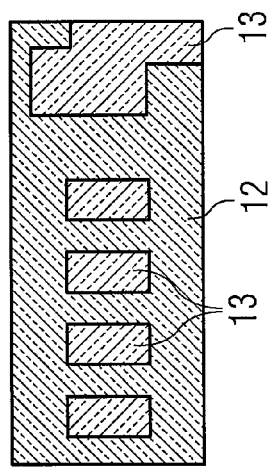
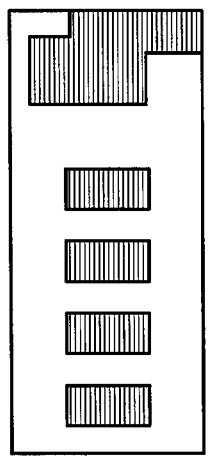
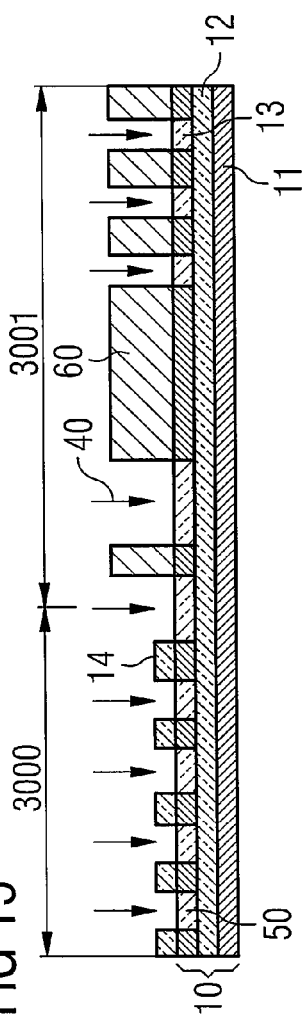
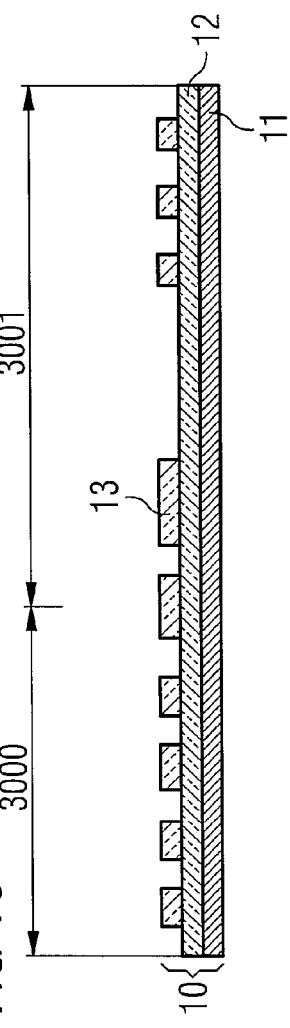
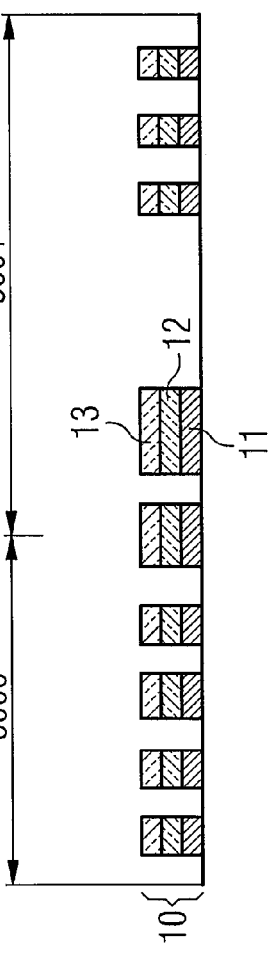

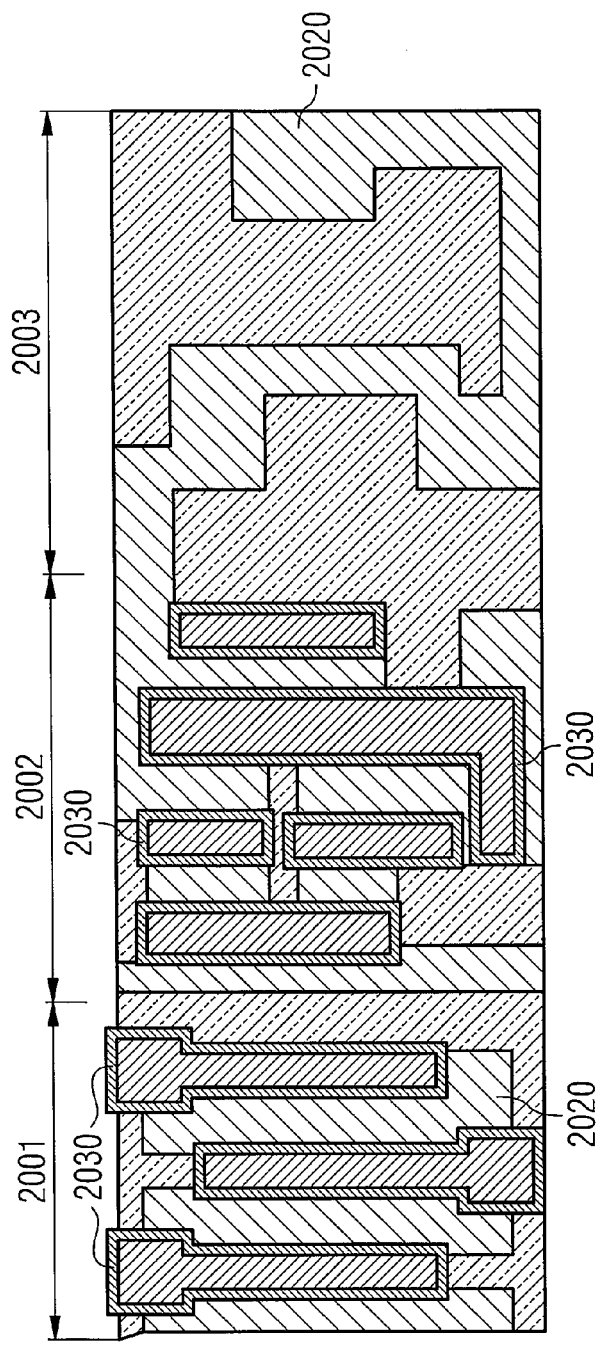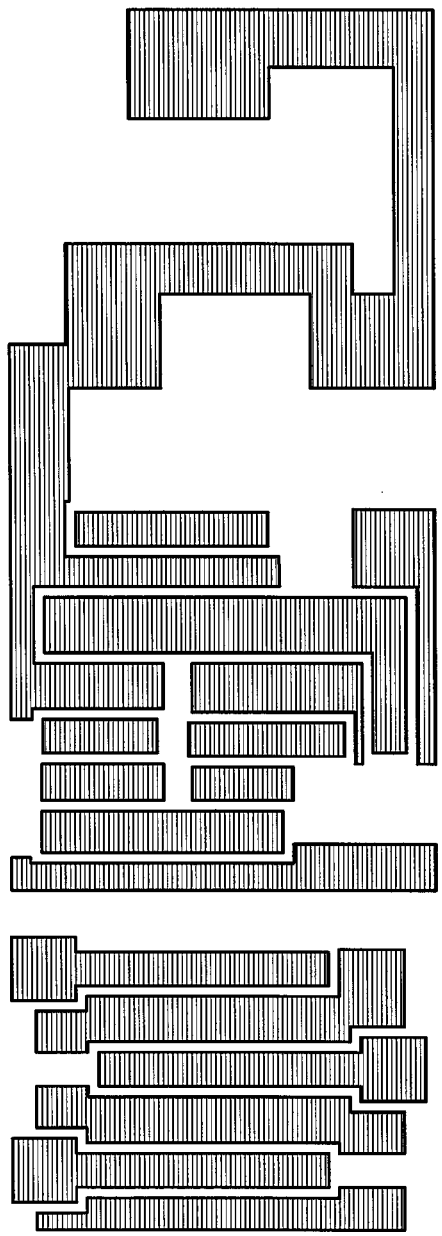
FIG 26
FIG 27

METHODS FOR GENERATING SUBLITHOGRAPHIC STRUCTURES

In the manufacturing of devices, e.g., semiconductor devices, small structures have to be manufactured in or on a substrate.

BRIEF DESCRIPTION OF THE DRAWINGS

For a more complete understanding of the present invention, and the advantages thereof, reference is now made to the following descriptions taken in conjunction with the accompanying drawings, in which:

FIGS. 1, 1A show the starting point for a first embodiment;
FIGS. 2, 2A show the result of the first process step of the first embodiment;
FIGS. 3, 3A show the result of the second process step of the first embodiment;
FIGS. 4, 4A show the result of the third process step of the first embodiment;
FIGS. 5, 5A show the result of the fourth process step of the first embodiment;
FIGS. 6, 6A show the result of the fifth process step of the first embodiment;
FIGS. 7, 7A show the result of a first process step of the second embodiment;
FIGS. 8, 8A show the result of a second process step of the second embodiment;
FIGS. 9, 9A show the result of the third process step of the second embodiment;
FIGS. 10, 10A show the result of the fourth process step of the second embodiment;
FIGS. 11, 11A show the result of the fifth process step of the second embodiment;
FIGS. 12, 12A show the starting point for a third embodiment;
FIGS. 13, 13A show the result of the first process step of the third embodiment;
FIGS. 14, 14A show the result of the second process step of the third embodiment;
FIGS. 15, 15A show the result of the third step of the third embodiment;
FIGS. 16, 16A show the result of the fourth process step of the third embodiment;
FIGS. 17, 17A show the result of the fifth process step of the third embodiment;
FIG. 26 shows a top view of the combined effect of the two masks of the sixth embodiment;
FIG. 27 shows a top view of a wafer result for the sixth embodiment.

DETAILED DESCRIPTION OF ILLUSTRATIVE EMBODIMENTS

Figure 18:
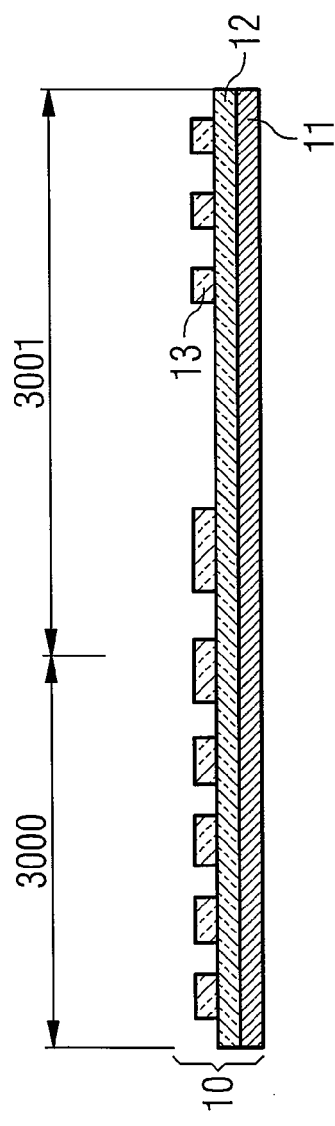
FIGS. 18, 18A show the starting point for a fourth embodiment.
Figure 18A:
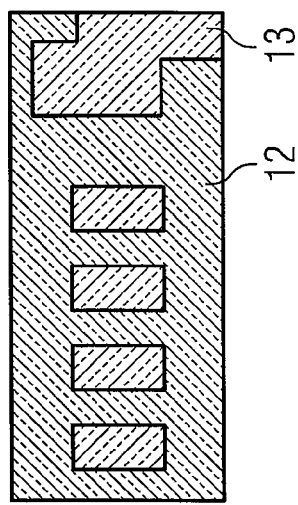
Figure 19:
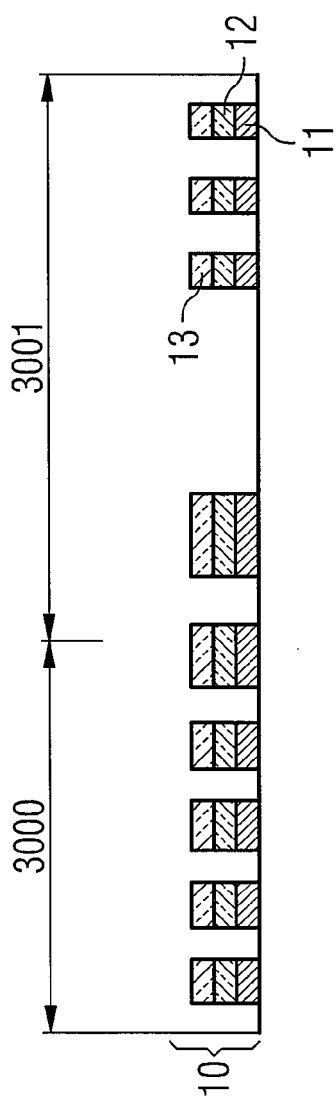
FIGS. 19, 19A show the result of the processing of the structure according to FIGS. 18, 18A.
Figure 19A:
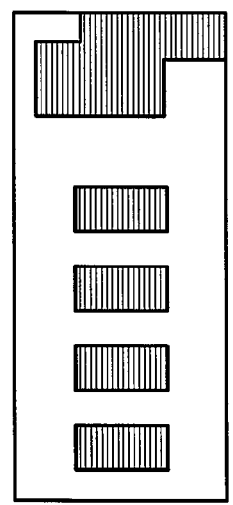

In the following different embodiments are described by the way of example. The person skilled in the art will understand that these embodiments are provided to give examples and should not be understood as limits to the scope of invention.

The first embodiment shown in FIGS. 1 to 6 is a memory chip, especially a DRAM memory chip. To the left of FIGS. 1 to 6A, the array region, here denoted as 3000, is shown. To the right of FIGS. 1 to 6A the support region, here denoted as 3001 is shown.

A DRAM memory chip is just an example of a semiconductor device which can be manufactured with one of the embodiments described herein. Other semiconductor devices could be an optoelectronic device, an analog circuit and/or a digital circuit, a microelectromechanical device (MEMS), a microprocessor, a biochip or a different memory chip such as a flash memory chip.

FIGS. 1 to 12 schematically show cross sections of different stages in the manufacturing of structures using, e.g., spacer techniques or pitch fragmentation techniques. A process step depicted can comprise more than one sub-step as will be described below.

The FIGS. 1A to 12A schematically shows top views of different stages corresponding to FIGS. 1 to 12.

Later some examples for in principle known spacer techniques are given. These examples are provided but other embodiments are feasible as well and that sublithographic structures, spacer structures, spacer techniques or pitch fragmentation techniques are just examples.

In FIG. 1 a cross section through a substrate 10 is given on which spacers 30 are positioned. A spacer structure 30 is one example of a sidewall structure, i.e., a structure positioned at a sidewall of a carrier structure. In the embodiment shown in FIG. 1, the sidewall structures 30 are on either side of a carrier structure 20. The person skilled in the art will recognize that the spacer structure 30 here can be made in different way, i.e., not by one of the spacer techniques described below.

In the embodiment shown in FIG. 1 the substrate 10 comprises a hard mask layer 11 and several layers 12, 13, 14 on top of the hard mask layer 11. This configuration is chosen to show the embodiment but it will be understood by the person skilled in the art that other configurations are possible.

The hard mask layer 11 shown in FIG. 1 is a carbon hard mask.

Above the hard mask layer 11, a second layer 12 made from silicon oxynitride (e.g., SiON) is positioned.

Above the second layer 12, a third layer 13 made from polysilicon is positioned.

Above the third layer 13, a fourth layer 14 made from silicon oxynitride (e.g., SiON) is positioned.

In another embodiment, the structure of FIG. 1 is used. In this embodiment the hard mask layer 11 is a carbon hard mask which can have a thickness of more than 100, in particular more 150 nm.

Above the hard mask layer 11, a second layer 12, which can be made from silicon oxynitride (e.g., SiON) is positioned. The second layer 12 can have a thickness of 5 to 50 nm or a thickness of 10 to 30 nm. One possible embodiment might have 25 nm.

Above the second layer 12, a third layer 13 made from polysilicon is positioned. The third layer 13 has a thickness of 25 nm. Other alternatives can have a thickness of 5 to 50 nm.

Above the third layer 13, a fourth layer 14 which can be made from silicon oxynitride (e.g., SiON) is positioned. The fourth layer 14 can have a thickness of 5 to 50 nm. Another embodiment might have a thickness of 10 to 40 nm. Another embodiment can have a thickness of 25 nm.

In alternative embodiments the substrate 10 can comprise more or less layers or layers made from different materials. The dimensions, especially thickness of the layers are just given as examples. The layers can have other thicknesses and the layers can have different thicknesses relative to each other. The above described embodiments are just examples other dimensions are as feasible as well.

An example with a different layer structure, i.e., without a hard mask layer will be described further below.

Here a stack of layers 11, 12, 13, 14 is described as a substrate 10. But in alternative embodiments the substrate can comprise a silicon wafer, a germanium wafer or an III-V material wafer. In particular, more layers (not shown here) can lie underneath the first layer 11 which will be structured (see FIG. 6).

In the first embodiment two linear structures 20 are positioned. The structures 20 can be made from any material or material combination, in particular but not restricted to carbon, silicon, nitride, $Al_2O_3$ and/or resist. As in the previously described embodiments, the materials are just given as examples, i.e., embodiments with other specifications are feasible.

In a variation of this first embodiment the first embodiment two linear structures 20 which can have a height between 15 and 150 nm are positioned. The structures 20 can be made from any material or material combination, in particular but not restricted to carbon, silicon, nitride, $Al_2O_3$ and/or resist. As in the previously described embodiments, the materials and the dimensions are just given as examples, i.e., embodiments with other specifications are feasible.

Here the structures 20 are linear silicon structures which are used as carrier structures for spacer structures 30. In alternative embodiments the structures 20 can be made from different materials and can have more complex structures, e.g., the structures 20 can be composites of linear structures or can be linear structures with a varying width.

Both sidewalls of the structures 20 are lined with sublithographic spacer structures 30. As in the previously described embodiments, the materials are just given as examples, i.e., embodiments with other specifications are feasible. In particular it is possible that the spacer structures 30 are not sublithographic.

In one additional embodiment, the structures 20 can have a width between 5 and 50 nm, e.g., 36 nm.

The spacer structures 30 can be manufactured by the spacer techniques described below in FIG. 47 to 55. Using these techniques it is possible to manufacture small structures which are arranged on pitches below the effective resolution of the used lithography process, in the following labeled as "sublithographic."

In FIG. 1A it can be seen that the linear structure 20 is lined on all four sides by the spacer structure 30.

The substrate 10, the structures 20 and the spacer 30 are used as the starting point for the following description.

In FIGS. 2, 2A the situation after the first process step is shown. In the first process step the linear silicon structure 20 is removed by an etching process selective to the material of the spacer 30 and the fourth layer 14 beneath the spacer structure.

In FIGS. 3, 3A the situation after the second process step is depicted. The second process step in this embodiment comprises the transfer etching into the fourth layer 14, here a silicon oxynitride (e.g., SiON) layer. Subsequently, the spacer structures 20 are etched away and the substrate 10 is subjected to a particle irradiation 40. Here the particle irradiation 40 comprises an ion implantation with boron. Another possible ion implantation could use phosphorus. Alternatively, other particles, such as atoms or charged particles like ions (e.g., inert gas atoms like helium, argon, xenon and/or nitrogen) or electrons can be used.

An embodiment with less layers and no transfer etch before an implantation will be described below.

The particle irradiation 40 leads to latent image 50 in the third layer 13 which will be in the following termed image layer 13. Latent image 50 can mean that the material structure in irradiated regions of the image layer 13 is different from the material structure of the image layer 13 in the non-irradiated regions. In the embodiment depicted, the remaining parts of the fourth layer 14 cover certain areas of the image layer 13 so that the particle irradiation 40 cannot reach into the image layer 13.

In the depicted embodiment the latent image 50 is manufactured by a structure generated from spacer structure 30. The latent image 50 is the inversion of the spacer structure 30.

Alternatively, the spacers 30 are not etched away and are used to cover certain regions of the image layer 13 from the particle irradiation 40. In this case there would be no fourth layer 14 and the latent image 50 would have been structured by the spacer structure 20 itself.

The person skilled in the art will recognize that the two alternatives can be used in combination in different regions of the substrate 10.

In FIGS. 4, 4A the situation after the third process step is shown. Again this process step comprises sub-steps. A subtractive cut mask 60 is deposited as a resist mask on the substrate 10. The cut mask 60 is also used to structure the support in an additive way. The subsequently opening of layer 13 is performed with RIE etch process which etches the silicon in certain regions.

In FIGS. 5, 5A the situation after the fourth process step is shown. Here the resist cut mask 60 has been stripped. Following the stripping, the non-irradiated parts of the image layer 13 are removed by an etching process (i.e., here the polysilicon in the image layer 13). The etching process used here is selective to the irradiated parts. Possible wet etching processes could use $NH_4OH$ and/or KOH since undoped poly can be etched selectively to doped poly.

As can be seen from FIGS. 5, 5A the latent image 50 areas of the image layer 13 remain on the second layer.

In other embodiments, a similar process flow might result in a structure in which the implanted area is removed at least partially by an etch process. One example can, e.g., be a crystalline $Al_2O_3$ layer which can be made amorphous by the irradiation. Afterwards it can be removed by a wet etch chemistry such as SCI or Piranha.

In another embodiment, a nitrided surface can be damaged by an implantation process. A subsequent oxidation is retarded in the non-damaged regions but oxide can be grown by oxidation in the damaged areas. Afterwards, a polysilicon layer can be removed by anisotropic etching against the oxide mask.

In FIGS. 6, 6A the situation after the fifth process step is shown. Here the silicon oxynitride (e.g., SiON) material of the second layer 12 and the hard mask layer underneath are etched using the image layer 13 as a mask. The pattern can be transferred into regions below, not depicted here. It is noted that in the embodiment shown, the structured layer 13 can be used to structure only the layer below layer 13.

In connection with this embodiment a sequence of processing steps has been described. The sequence can be repeated in the manufacturing of a product.

The second embodiment is a variation of the first embodiment. The first process steps are the same as the ones shown in FIGS. 1, 2, 1A and 2A. The structure in FIGS. 2, 2A forms the basis for the further processing according to the second embodiment.

In FIGS. 7, 7A the situation after the first process step of the second embodiment is depicted. This comprises the transfer etching into the fourth layer 14, here a silicon oxynitride (e.g., SiON) layer. Subsequently, the spacer structures 20 are etched away. Then, an optional nitridation by, e.g., a plasma nitridation is applied to the whole structure. Subsequently, the substrate 10 is subjected to a particle irradiation 40. Here the particle irradiation 40 comprises an ion implantation with boron. Another possible ion implantation could use phosphorus, arsenic, oxygen or nitrogen. Alternatively, other particles, such as atoms (e.g., inert gas atoms like helium, argon, xenon) or electrons can be used.

The particle irradiation 40 leads to latent image 50 in the third layer 13 which will be now termed image layer 13. Latent image 50 can mean that the material structure in irradiated regions of the image layer 13 is different from the material structure of the image layer 13 in the non-irradiated regions. In the embodiment depicted, the remaining parts of the fourth layer 14 cover certain areas of the image layer 13 so that the particle irradiation 40 cannot reach into the image layer 13.

In the depicted embodiment the latent image 50 is manufactured by a structure generated from spacer structure 30.

Alternatively, the spacers 30 are not etched away and are used to cover certain regions of the image layer 13 from the particle irradiation 40. The latent image 50 would have been structured by the spacer structure 20 directly.

The person skilled in the art will recognize that the two alternatives can be used in combination in different regions of the substrate 10.

In FIGS. 8, 8A the structure is subjected to an oxidation process step (oxide layer 15) which is followed by an optional nitride strip. The oxidation may be either enhanced by the implanted dopants or not stopped by the damaged nitride.

The regions of the latent image in the image layer 13 have been replaced by oxide.

In FIGS. 9, 9A the situation after the oxidation and the structuring of a resist cut mask 60 is shown. This is a similar situation as the one shown in FIG. 4 above, i.e., a cut mask support structures and a wet polyetch are performed.

In FIGS. 10, 10A the structure is shown with the undoped polysilicon in the first layer 11 removed. The oxide layer on top of the stack can now be used to structure the substrate 10 below. Therefore FIG. 11 is analogue to FIG. 6 above.

The starting point of the third embodiment is chosen identical to the first embodiment. Therefore, the description of FIGS. 1, 1A applies in an analog way to FIGS. 12, 12A.

The same applies to FIGS. 13, 13A which shows the substrate 10 of FIGS. 2, 2A. As in FIGS. 2, 2A, the carrier structure 20 for the spacer structures 30 has been removed. Now the spacer structures 30 can be used as a mask for the third layer 13.

In FIGS. 14, 14A the situation after a removal of the spacers 30 and a subsequent structuring of the fourth layer 14 is shown.

In FIGS. 15, 15A the situation after the second process step, comprising different sub-steps is shown. First a resist cut mask 60 is applied to the substrate 10. This cut mask 60 is then used to define the area outside the array, e.g., the support. Subsequently, a particle irradiation, here again a boron ion implantation 40, is used. The cut mask 60 and the spacer structure 30 are both shielding certain parts of the third layer 13, the image layer from the boron implantation. The boron implantation 40 creates a latent image 50 in the image layer 13.

In FIGS. 16, 16A, the cut mask 60 and the spacer structures 30 have been removed by etching. Subsequently, the non-irradiated (here the non-implanted) regions of the image layer 13 are selectively etched against the irradiated (here the implanted) regions of the image layer 13 by using alkaline, e.g., a $NH_4OH$ and/or KOH chemistry.

FIGS. 17, 17A are analogues of FIGS. 6, 6A, so that the respective description applies.

The fourth embodiment is a variation of the third embodiment to the extent that it uses the structure as shown in FIG. 14, as starting point, but a similar process as in embodiment 2.

In FIG. 15, a resist is applied with a cut mask. A particle irradiation is performed. After the resist 60 is stripped, optionally an oxidation can be performed and mask 14 can be removed.

The latent image in layer 13 will be developed, e.g., by etching undoped polysilicon with KOH or $NH_4OH$ or by etching polysilicon against the oxide mask as described in the first or second embodiments. In FIG. 17 the image in layer 13 can be transferred to the layers beneath. The result is shown in FIGS. 17, 17A.

Compared to embodiment 2, the support area can be defined by the inversion of the cut mask 60 pattern by using the cut mask 60 directly for the implantation, i.e., the nitrided surface in open areas will be damaged by the implant. The oxidation turn these areas into a mask for the subsequent etch of poly.

In FIGS. 20 to 23 top views of different stages in the processing of a substrate are shown highlighting the use of only two masks to fabricate, e.g., relevant areas in chip manufacturing. FIGS. 20 to 23 refer to the first and second embodiments described above; therefore reference is made to the above description.

Figure 20:
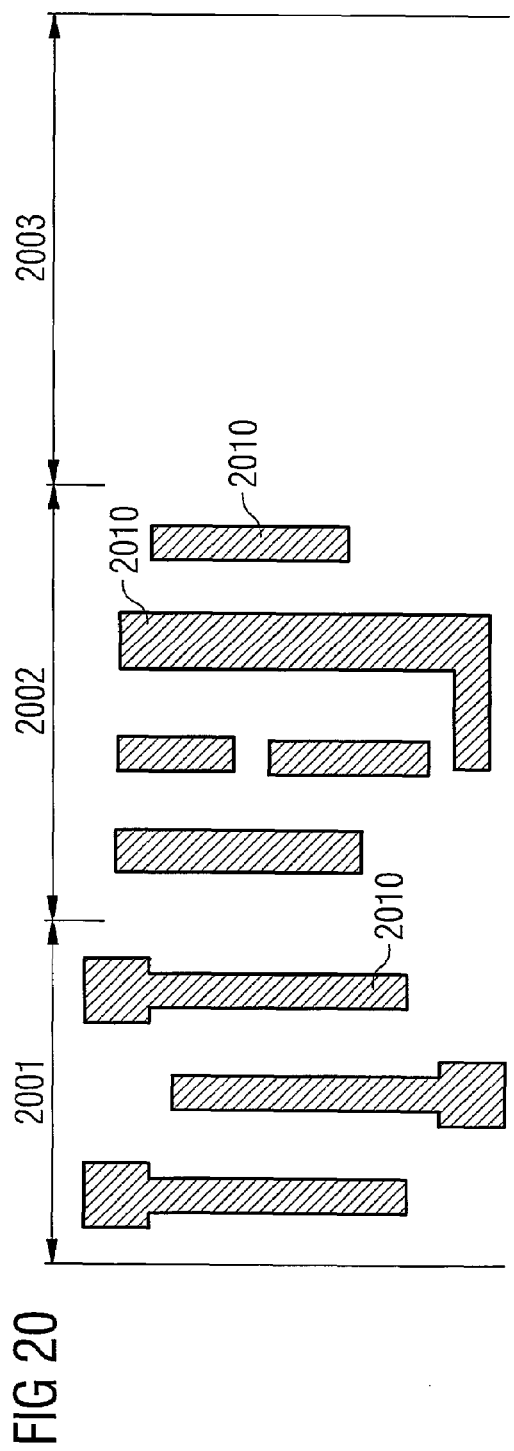
FIG. 20 shows a top view of a part of a first mask for a fifth embodiment.

In FIG. 20 on the left in region 2001 a clip of a regular array of similar structures is shown. The structures comprise landing pads. Such arrays are, e.g., present in memory chips.

Beside the array, a region 2002 with logic-like structures with a high line/space density, called here a core circuit is shown. This comprises non-regular structures in a non-regular pattern. Beside the core circuit 2002, logic-like patterns with relaxed line/space structures are shown in region 2003. As will become clear, the embodiments described here are suitable for manufacturing different devices, such as those, e.g., a memory chip.

In a first lithography step structures 2010 corresponding to the carriers in FIG. 1 are manufactured (see FIG. 20) using a first mask.

Figure 21:
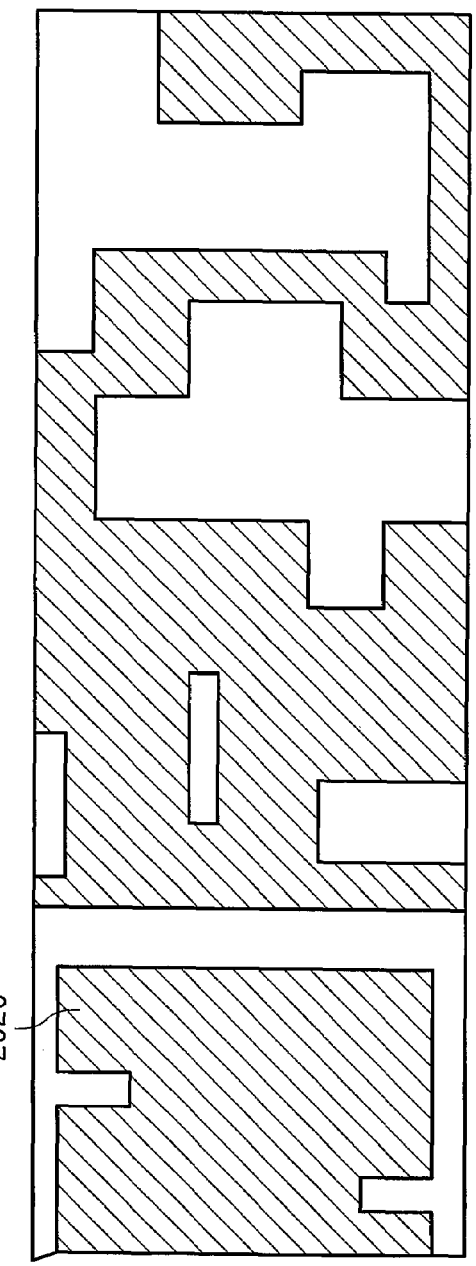
FIG. 21 shows a top view of a part of second mask for the fifth embodiment.

In FIG. 21 the shape of a cut mask 2020 (i.e., a second mask after the first mask to create the carrier) is shown. The array is fully covered. In the core circuit area small hole structures may be present in the mask. This mask corresponds, e.g., to resist 60 in FIG. 4. In the periphery large line/space patterns are shown.

Figure 22:
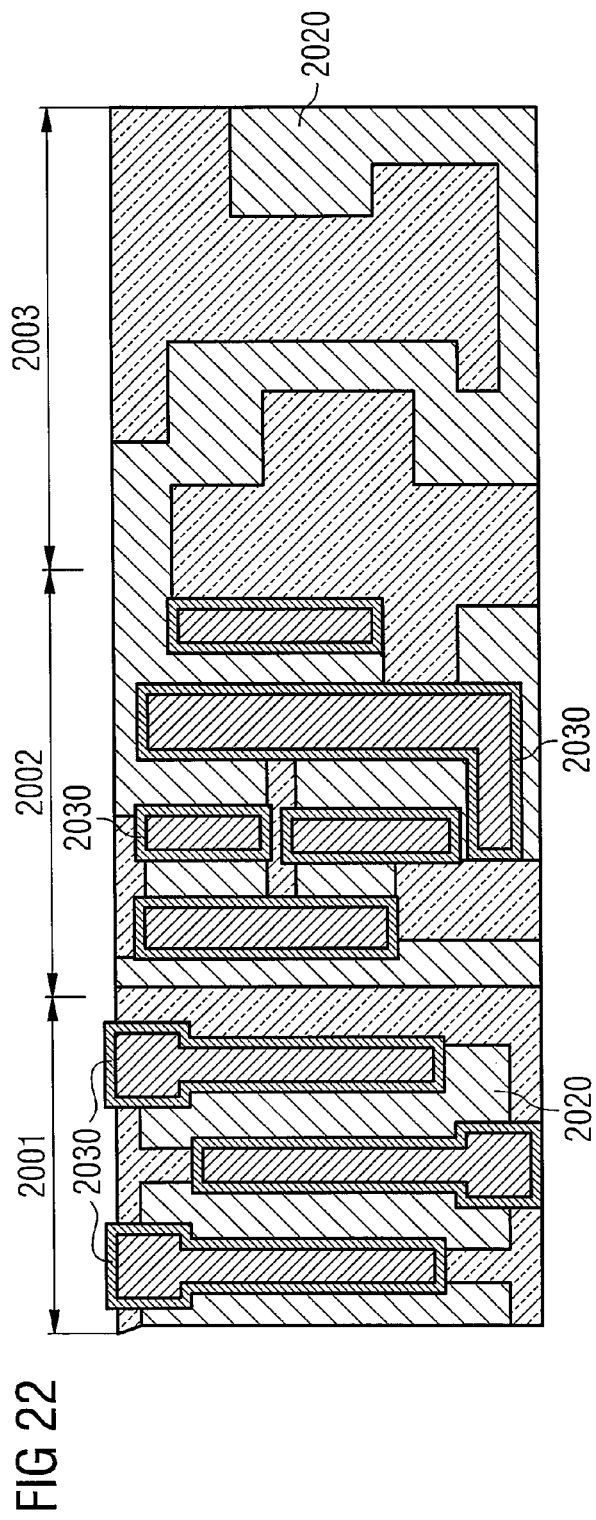
FIG. 22 shows a top view of the combined effect of the two masks of the fifth embodiment.
Figure 23:
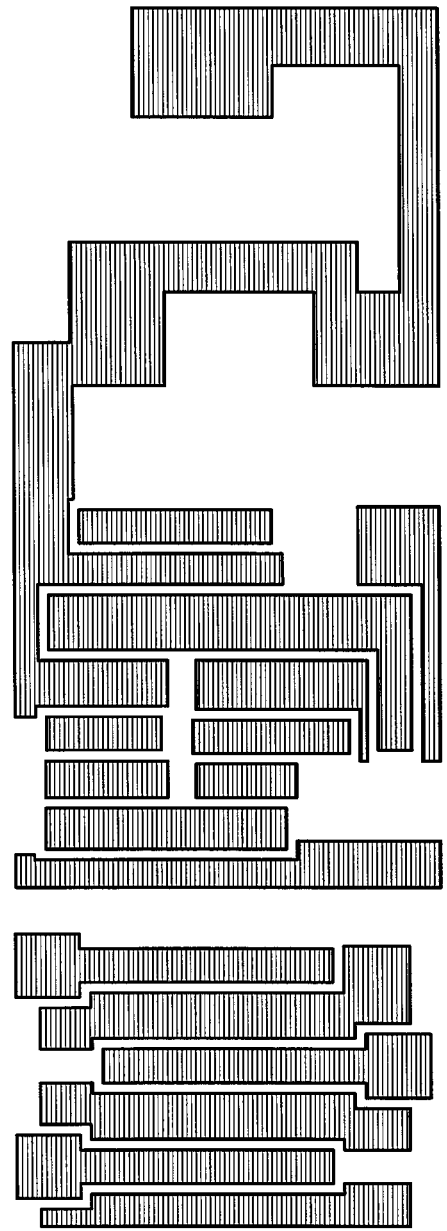
FIG. 23 shows the result on the wafer for the fifth embodiment.
Figure 24:
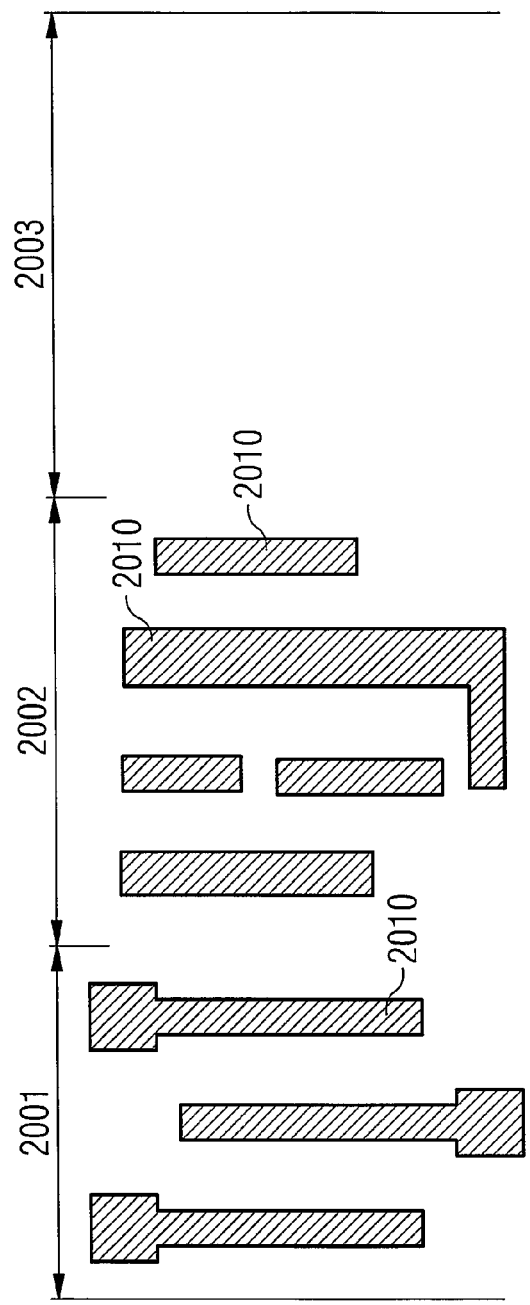
FIG. 24 shows a top view of a part of a first mask for a sixth embodiment.
Figure 25:
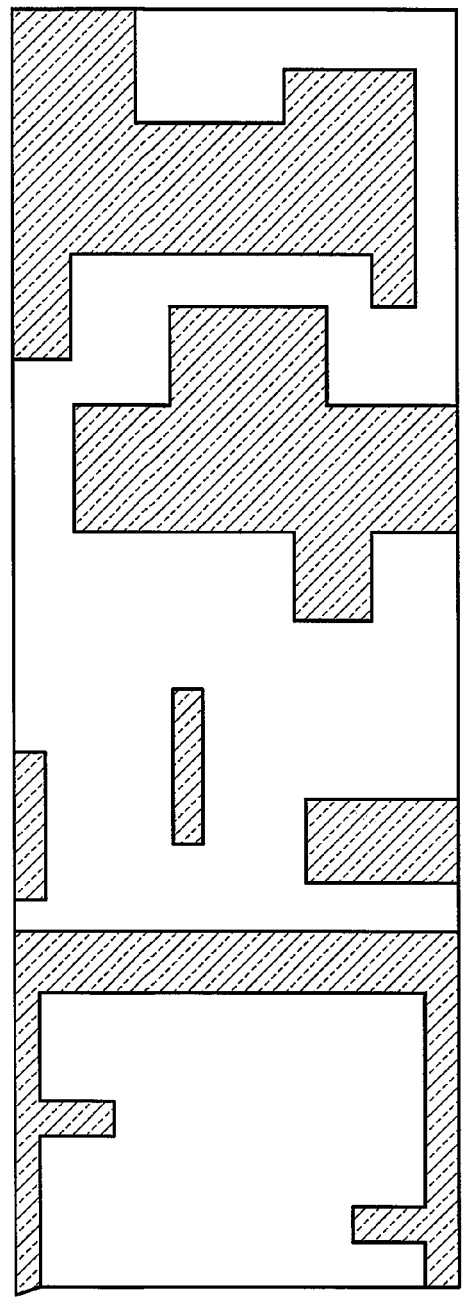
FIG. 25 shows a top view of a part of a second mask of the sixth embodiment.
Figure 28:
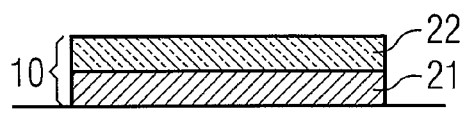
FIGS. 28 to 36 showing different process steps for a seventh embodiment.
Figure 29:
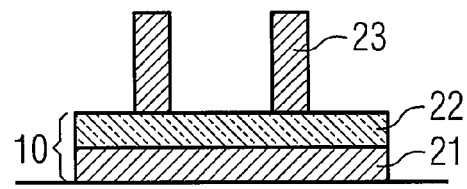
Figure 30:
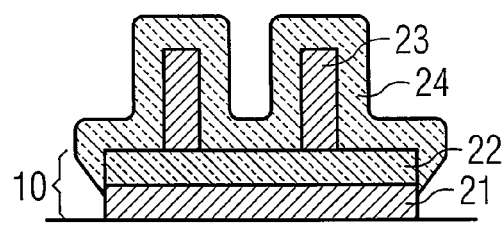
Figure 31:
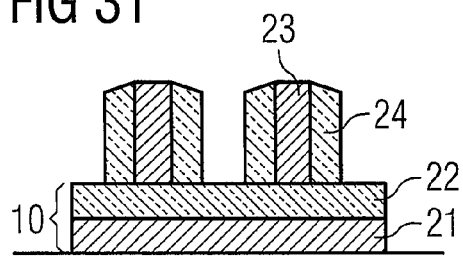
Figure 32:
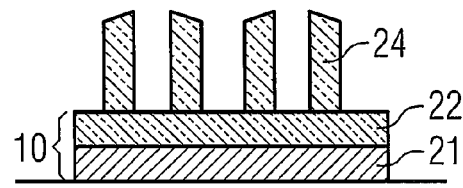
Figure 33:
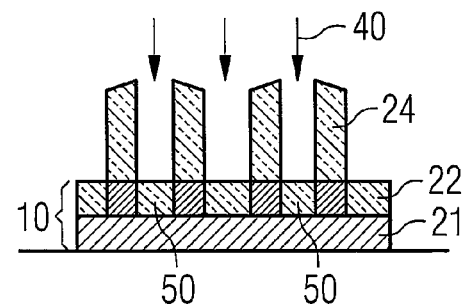

In FIG. 22 the combined effect of the first mask and the second mask is shown corresponding to FIG. 4. The structures 2010 have been lined with spacers 2030 as will be described below in more detail by pitch fragmentation technique. In FIG. 23 the result on the wafer is shown corresponding to FIG. 5 or 6. This shows that all structures can be manufactured by only two masks.

FIGS. 24 to 27 are analogue to FIGS. 20 to 23, only that in this embodiment a negative mask is used and the process corresponds to the fourth embodiment. This becomes apparent in the use of the cut mask in FIG. 25, which is the inverse of the mask shown in FIG. 21.

For a person skilled in the art it is evident that the description of the embodiments is exemplary, i.e., all alternatives described in the context of the first embodiment could be applied to other embodiments as well.

The embodiments shown here in an exemplary way use two masks. One mask to create the structures 20 used as carriers for the spacer structures 30. The second mask is used for the subtractive cut process and the additive support lithography. In this case the second lithography can operate on a flat hard mask, i.e., a surface with no topography using the first pattern stored into the hard mask as a latent image 50.

A seventh embodiment is described in FIGS. 28 to 36 in which less layers than in the previously described embodiments are used. As in the previous embodiments, the materials used in the description of the embodiments are exemplary.

In this embodiment two layers 21, 22 are positioned on some other substrate (not depicted here), which can, e.g., be a carbon hardmask or any other structured layer heap or wafer. In the embodiment shown in FIG. 28 a first layer 21 of, e.g., silicon oxynitride has a second layer 22 made of, e.g., polysilicon on top.

In the next process step (FIG. 29) a carrier structure 23 (e.g., resist, bilayer resist, multilayer resist, carbon hardmask) is positioned on the second layer 22.

In the next process step (FIG. 30) a spacer layer 24 (e.g., made of $SiO_2$) is deposited on the second layer 22 and the carrier structure 23. The $SiO_2$ may be deposited using a low temperature process.

In the next process step (FIG. 31) the horizontal parts of the $SiO_2$ layer 24 are etched so that the carrier structure 23 is exposed to the surface.

In the following process step (FIG. 32) the carrier structure 23 is removed by an etching process, so that the essentially vertical spacer structures from the spacer layer 24 remain.

An irradiation 40 (FIG. 33) with a particle implantation in this example modifies the top portion of the substrate not covered by the spacer structures 24. Different embodiments for the irradiation have been described above. Reference is made to the respective description. Like in the examples described above, the second layer 22 comprises regions which are non-implanted under the spacer structures 24 and regions which are implanted, i.e., regions which are not covered with a spacer structure 24. Therefore, the second layer 22 comprises an image layer in this embodiment since a latent image 50 is formed underneath a spacer structure 24 therein.

Figure 34:
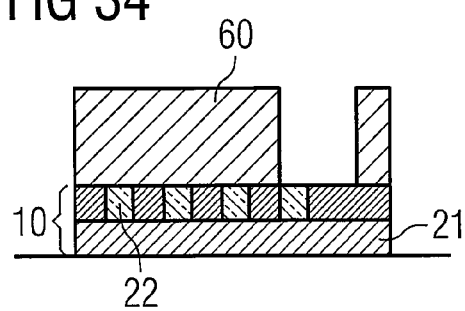
Figure 37:
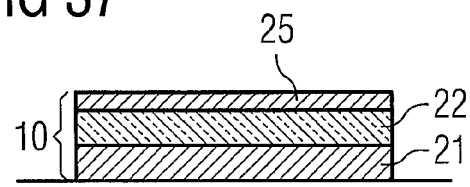
FIGS. 37 to 46 showing different process steps for an eighth embodiment.
Figure 35:
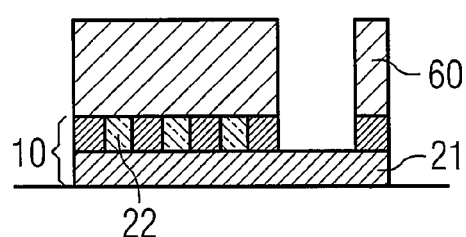
Figure 38:
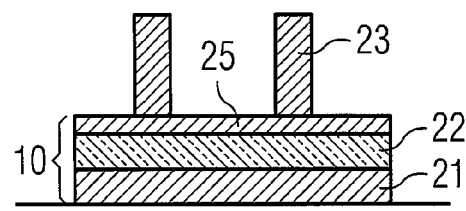
Figure 36:
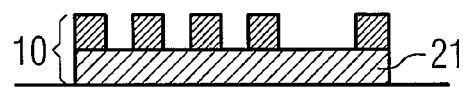
Figure 39:
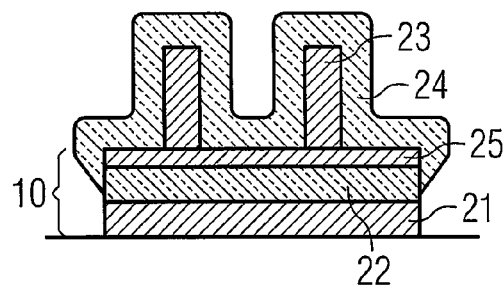
Figure 40:
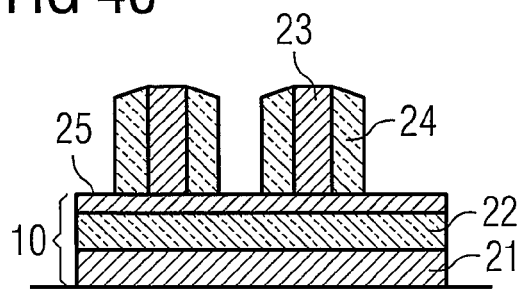

After the irradiation, certain regions are covered with a cut mask 60 which is then subjected to a second mask lithography (FIG. 34). Using the cut mask 60, the second layer 22 is at least in parts removed (FIG. 35).

Subsequently, the cut mask 60 is stripped and the remaining polysilicon in the irradiated regions is removed for, e.g., by wet etching (FIG. 36) so that the structured second layer 22 can be used as a mask to structure the layer or the layers below the second layer 22.

In FIGS. 37 to 46 an eighth embodiment is described which is a variation of the embodiment shown in FIGS. 28 to 36.

Starting point are a first layer 21, here comprising silicon oxynitride and a second layer 22, here comprising polysilicon. On top of the second layer 22, an additional layer 25 is positioned. This additional layer 25 can comprise a nitride, e.g., by nitridation and/or an oxide (such as $Al_2O_3$).

In the next process step (FIG. 38) a carrier structure 23 (e.g., resist, bilayer resist, multilayer resist, carbon hardmask) is positioned on the additional layer 25.

In the next process step (FIG. 39) a spacer layer 24 (here made of $SiO_2$) is deposited in on the additional layer 25 and the carrier structure 23. In one embodiment, the $SiO_2$ is deposited using a low temperature process.

In the next process step (FIG. 40) the horizontal parts of the of the $SiO_2$ layer 24 are etched so that the carrier structure 23 is exposed.

In the following process step (FIG. 41) the carrier structure 23 is removed by an etching process, so that the essentially vertical spacer structures from the spacer layer 24 remain.

An irradiation 40 (FIG. 42) with a particle implantation in this example modifies the top portion of the substrate not covered by the spacer structures 24. Different embodiments for the irradiation have been described above. Reference is made to the respective description. Like in the examples described above, the additional layer 25 comprises regions which are non-implanted under the spacer structures 24 and regions which are implanted, i.e., regions which are not covered with a spacer structure 24. The additional layer 25 is damaged due to the implantation 40. Therefore, the additional layer 25 comprises an image layer in this embodiment since a latent image 50 is formed therein.

After the irradiation, the spacer structures 24 are stripped and the top layer is oxidized. The effect is here that the irradiation or implantation damages, e.g., a nitride grown by nitridation or the oxide layer 25. During a subsequent oxidation, oxide is grown in the areas of the destroyed nitridation and not grown due to retardation in areas with intact nitridation.

Figure 43:
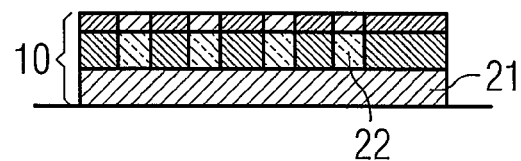
Figure 41:
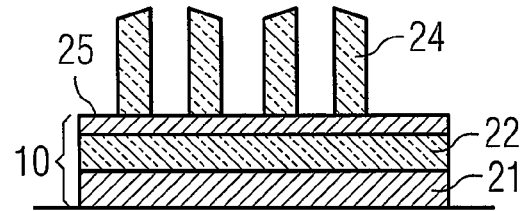

Since the additional layer comprises non-irradiated and irradiated regions, the oxidation is effected differently in the top layer (FIG. 43).

Figure 44:
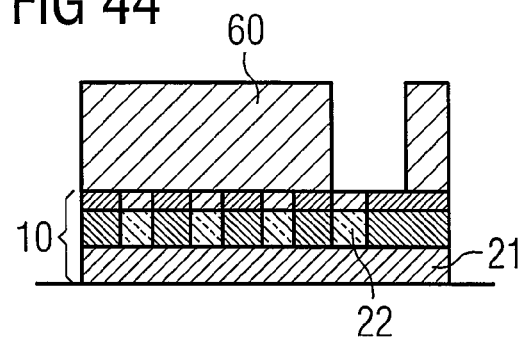
Figure 42:
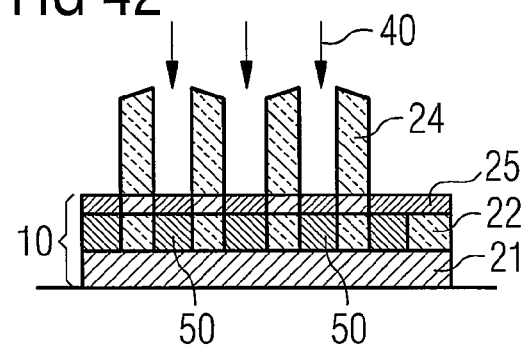
Figure 45:
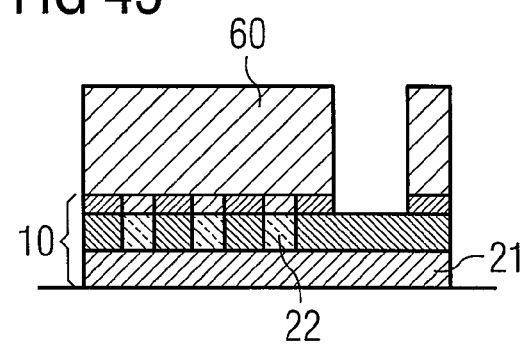
Figure 46:
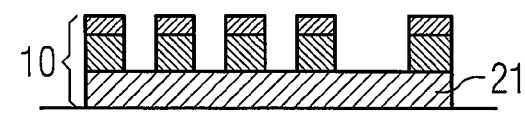

Then certain regions are covered with a cut mask 60 which is then subjected to a second mask lithography (FIG. 44). Using the cut mask 60, the additional layer 25 (i.e., here the oxidized part) is at least in parts etched (FIG. 45).

Subsequently, the cut mask 60 is stripped and the nitride is wet etched (hot phosphor etch) (FIG. 46) so that the structured additional layer 25 and the structured second layer 22 can be used as a mask to structure the layer or the layers.

As mentioned above, the spacer structures 24, 30 can be manufactured by any technique, such a pitch fragmentation with spacers. In FIGS. 47 to 55, examples for different spacer techniques are given.

Figure 47:
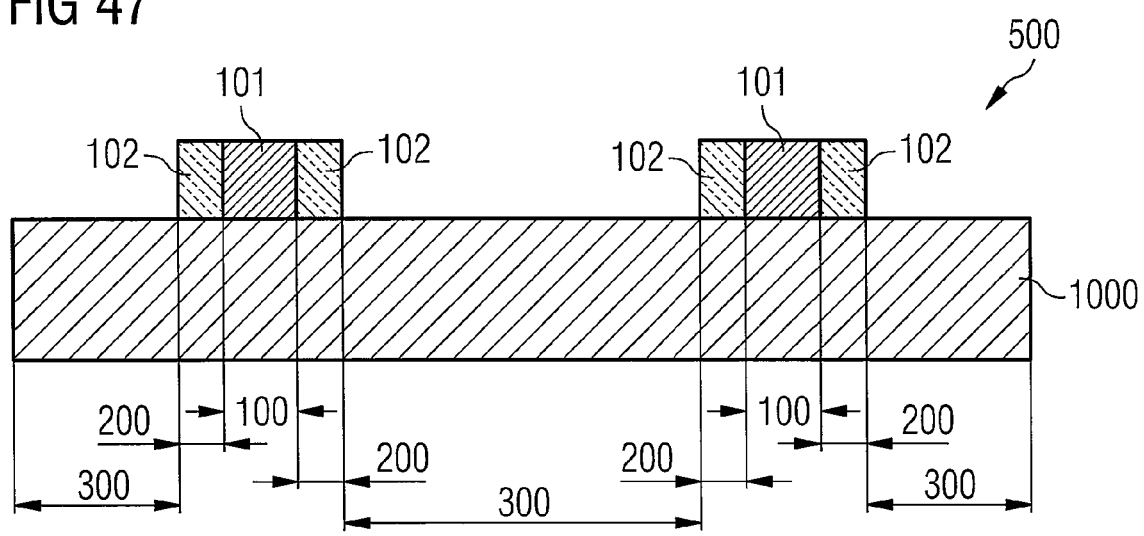
FIG. 47 a cross section of a structure to be subjected to the first embodiment of a pitch fragmentation technique.

In FIG. 47 a cross section of a general structure 500 on a substrate 1000 in a semiconductor device is depicted. This structure 500 will be used to demonstrate an exemplary embodiment of a pitch fragmentation technique, i.e., a line by spacer technique (or a pattern by spacer technique if a more complex structure is used).

The general structure 500 shown in FIG. 47 might represent among other possibilities a line in a memory chip or a microprocessor or any other integrated circuit. The structure could also represent a line in an optoelectronic device or a microelectromechanical device (MEMS). The person skilled in the art will recognize that the pitch fragmentation techniques described here are not limited to straight lines but can be used to manufacture more complex patterns.

In the embodiment of the pitch fragmentation according to FIG. 47, the initial structure 101 is lined with a sidewall structure 102 adjacent to the initial structure 101. The area of the substrate 1000 covered by the initial structure 101 is indicated by 100, the area covered by the sidewall structure 102 are indicated by 200.

The area 300 not covered by the initial structure 10 and the sidewall structure 102 remains free of material on its surface.

In the line by spacer technique shown, e.g., in FIG. 47 the area 100 covered by the initial structure 101 and the area 300 are transferred into the substrate 1000. Therefore, the initial structure 101 has to be removed, e.g., by an etching process which is selective to the sidewall structures 102 and the substrate 1000.

Figure 48:
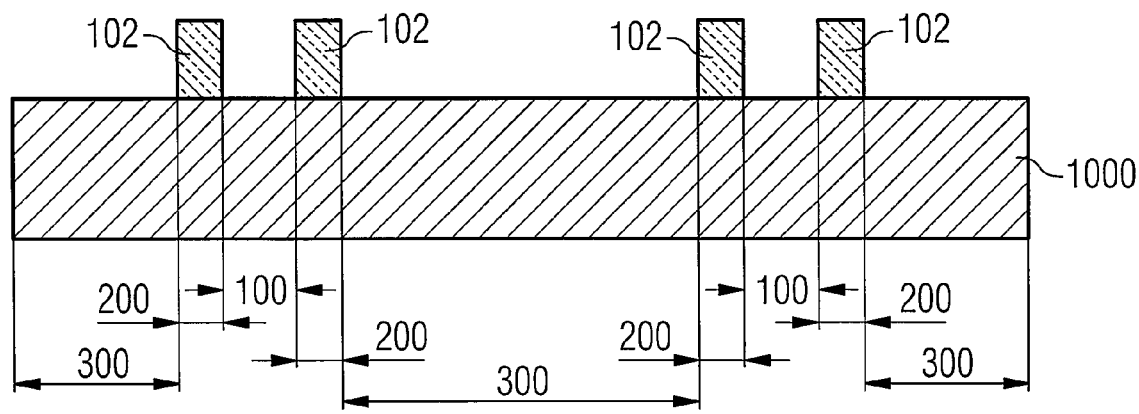
FIG. 48 a cross section after the first process step of the first embodiment of the pitch fragmentation technique according to FIG. 47.

In FIG. 48 it is shown that only the sidewall structures 102 remain as spacer structures, since the spacer structures 102 have a relatively small width. A sublithographic pitch (i.e., a dimension of a pitch which is smaller than the capability of a certain illumination source) can be achieved due to the fact that each initial structure 101 has two sidewalls 102, thereby doubling the density of structures. As mentioned above, other dimensions than sublithographic pitches are feasible.

It will be understood by the person skilled in the art that the substrate 1000 does not have to be a single material but it might comprise structured layers.

Figure 49:
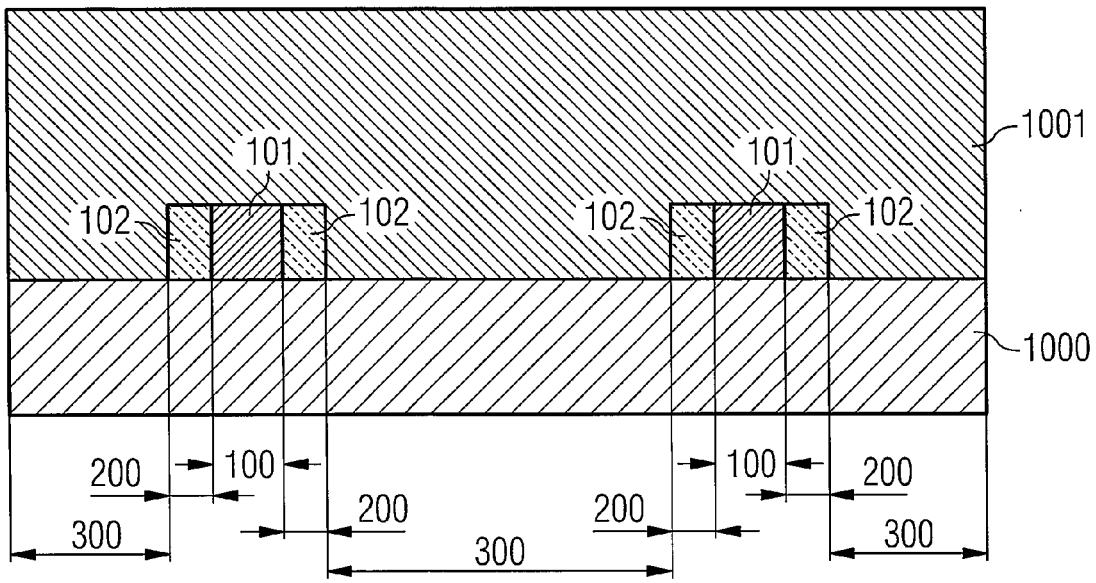
FIG. 49 a cross section of a structure to be subjected to the third embodiment of the pitch fragmentation technique.

In FIG. 49 a variation of the embodiment of FIG. 47 is shown in which a fill technique is used to transfer the area 300 and 100 into the substrate 1000. In this embodiment the area 300 is filled by some material. Starting with the layered stack as in FIG. 49, a layer 1001 is deposited, covering the initial structure 101, the sidewall structure 102 (i.e., the spacer) and the area 300.

Figure 50:
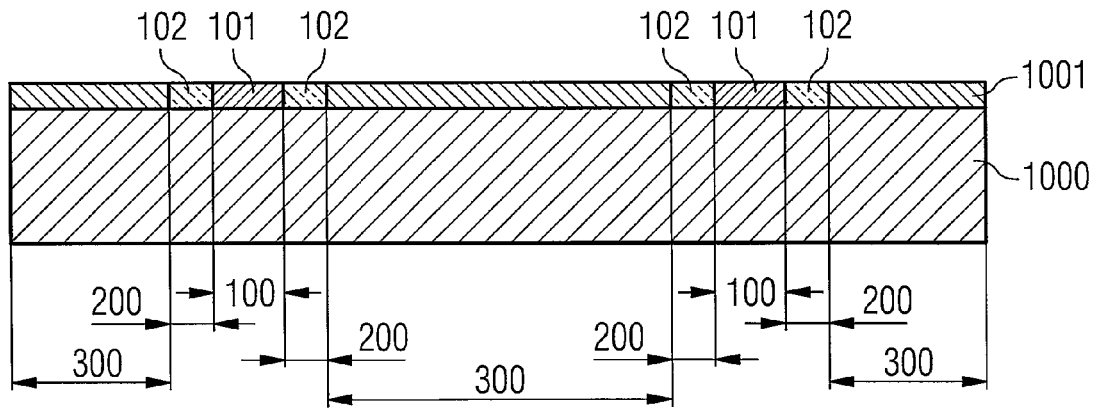
FIG. 50 a cross section after the first process step of the third embodiment of the pitch fragmentation technique according to FIG. 49.

This stack is then recessed, e.g., by etching or CMP as shown in FIG. 50. Subsequently, the spacer structures 102 are removed, e.g., by etching the spacers 102 selectively to the initial structures 101 and the layer in area 300. Now the lines (or the pattern) formed by the spacer structure 102 can be transferred into the substrate 1000. This technique transfers the inverse pattern of the spacers into the substrate, i.e., it the inverse pitch fragmentation technique of line by spacer.

Figure 51:
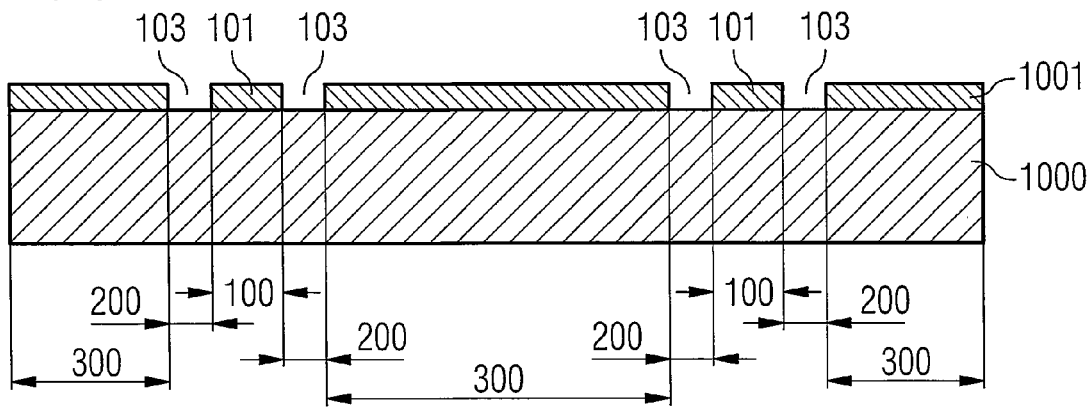
FIG. 51 a cross section after the second process step of the third embodiment of the pitch fragmentation technique.

This is shown in FIG. 51. The spacers 102 are removed by an etching process so that openings 103 are created. The remains of the layer 1001 and the initial structure 101 form a mask.

Figure 52:
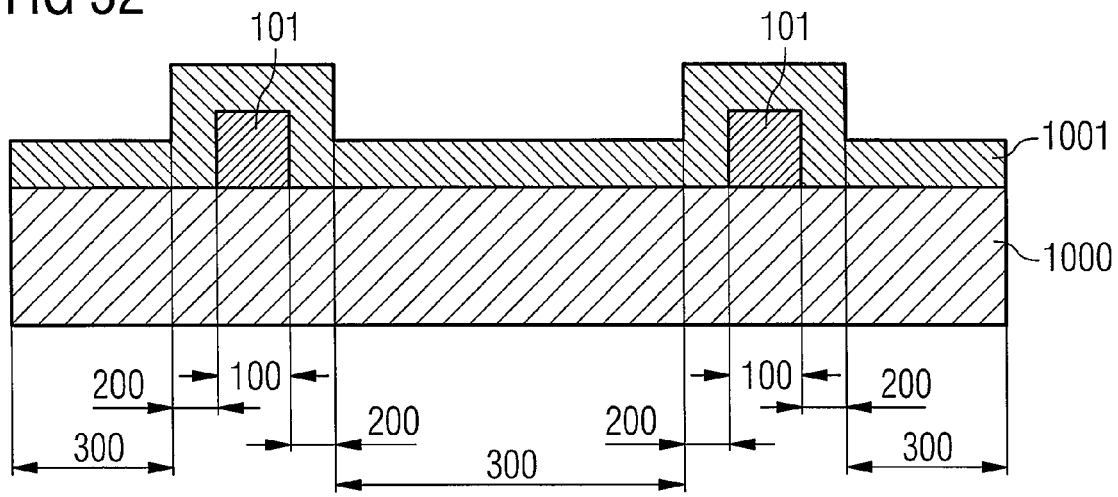
FIG. 52 a cross section of a structure to be subjected to a third embodiment of a pitch fragmentation technique.

Another fill technique is a line by liner fill (or pattern by liner fill). In FIG. 52 an initial structure 101 is covered by a first layer 1001. The first layer 1001 lines, among other areas, the sidewalls of the initial structure 101. Therefore, the sidewall structures covering the areas 1001 are made by a liner material, rather than a spacer. A spacer etch is not required in this embodiment.

Figure 53:
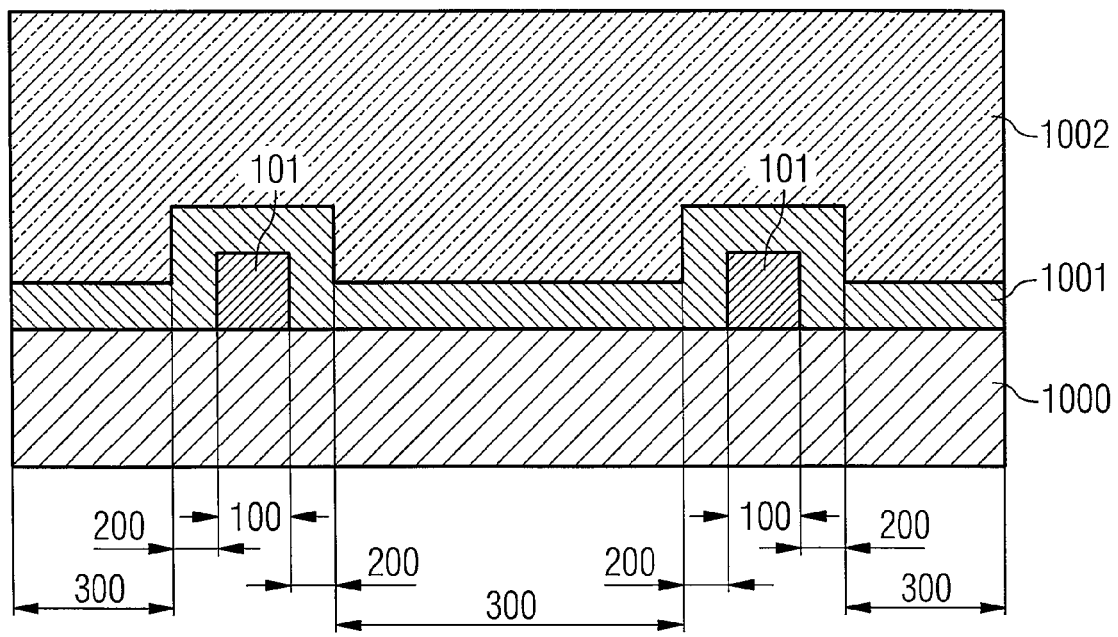
FIG. 53 a cross section after the first process step of the third embodiment of the pitch fragmentation technique according to FIG. 52.

Subsequently, the stack shown in FIG. 52 is covered with a second liner 1002 as shown in FIG. 53.

Figure 54:
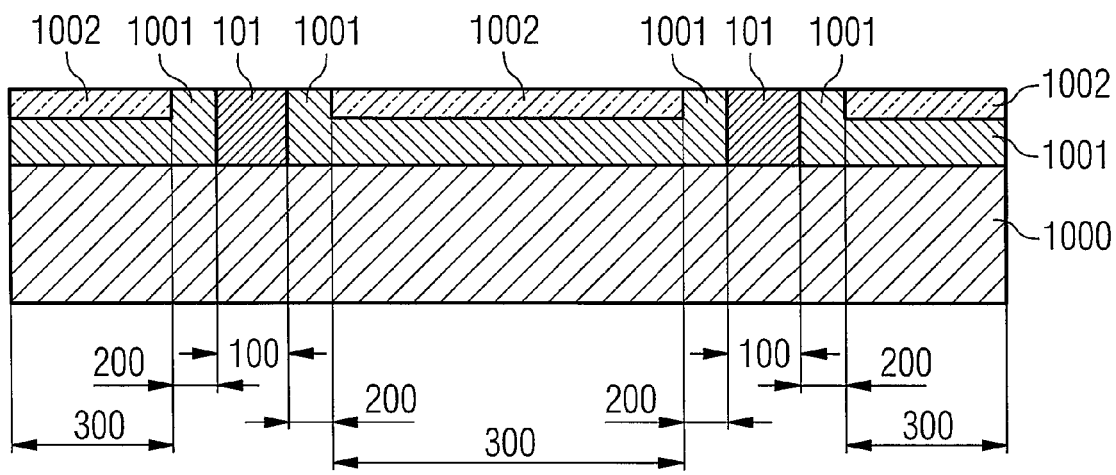
FIG. 54 a cross section after the third process step of the third embodiment of the pitch fragmentation.
Figure 55:
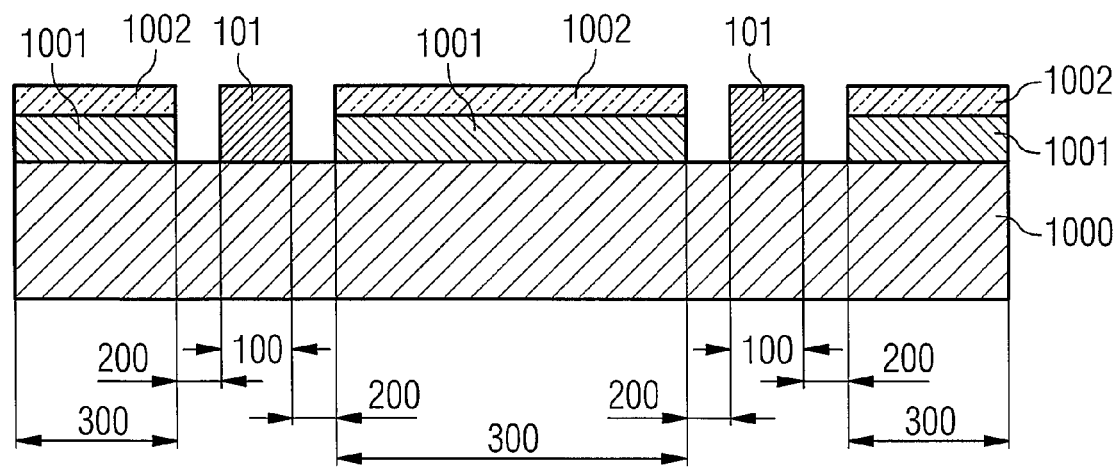
FIG. 55 a cross section after the third process step of the third embodiment of the pitch fragmentation.

Subsequently, the second layer 1002 is recessed or planarized as indicated in FIG. 54. In FIG. 55 it is shown that the liner material from the first layer 1001 is then removed, e.g., by an anisotropic etching which is selective against the material of the initial structure and the material of the second liner.

The persons skilled in the art will recognize that the pitch fragmentation techniques can be used more than once in an area leading to higher order pitch fragmentations, i.e., ever smaller structures can be manufactured. Furthermore, it is possible to exploit different selectivities between materials to define combinations of regions or subregions to define the pattern to be transferred into the substrate.

In addition the person skilled in the art will recognize that the embodiments of the pitch fragmentation techniques can be modified in many ways and can be used in different combinations and with all kind of materials. The principles of the pitch fragmentations are not exhaustively covered by the examples given here.

In the present description of different embodiments, the term process step was used. The person skilled in the art will note that term process step can comprise more than one particular processing, e.g., etching. As was indicated in the description above sometimes more then one sub-steps were described together as one process step. Furthermore, it is clear that between two process steps other processes or sub-steps might be applied.

Furthermore, the different process steps in the embodiments described are exemplary. The person skilled in the art will recognize that individual process steps of one embodiment can be combined with individual process steps from another embodiment.

What is claimed is:

1. A method of forming a structure in a substrate, the method comprising:
    forming a sidewall structure on a mask layer covering the substrate defining a first pattern of an exposed top surface of the mask layer;
    forming an irradiated area in the mask layer by irradiating the first pattern;
    removing the sidewall structure;
    after removing the sidewall structure, forming a second pattern on the mask layer using a cut mask at least partially covering the irradiated area, the second pattern not including sidewall structures and different than the first pattern;
    etching areas in the mask layer not covered with the second pattern;
    removing the second pattern; and
    removing the non-irradiated area of the mask layer.

2. The method according to claim 1, wherein irradiating comprises irradiating normal to a substrate surface.

3. The method according to claim 1, wherein the sidewall structure is used as a shadowing structure of the irradiation.

4. The method according to claim 1, wherein irradiating is performed before forming the second pattern.

5. The method according to claim 1, wherein the substrate comprises a wafer, a silicon wafer, a germanium wafer, a III-V material wafer, a structured wafer, a structured silicon wafer, a structured germanium wafer, or a structured III-V material wafer.

6. The method according to claim 1, wherein the irradiating comprises at least the irradiating with ions, atoms or electrons.

7. The method according to claim 6, wherein the irradiating comprises irradiating with helium atoms, argon atoms or xenon atoms.

8. The method according to claim 1, wherein the irradiating comprises performing an ion implantation.

9. The method according to claim 8, wherein the ion implantation comprises implanting ions selected from the group consisting of boron, oxygen, nitrogen and phosphorus.

10. The method according to claim 1, wherein the non-irradiated area is removed at least partially by a selective etch process.

11. The method according to claim 10, wherein the mask layer comprises silicon and a non-irradiated portion of the mask layer is selectively etched by wet chemistry comprising one of $NH_4OH$ and KOH.

12. The method according to claim 1, wherein an irradiated area of the mask layer is at least partially removed after the irradiating.

13. The method according to claim 12, wherein the irradiated area is removed at least partially by an etch process.

14. The method according to claim 1, wherein the second pattern is formed before the irradiation step.

15. The method according to claim 1, wherein the sidewall structure comprises a material selected from the group consisting of nitride, oxide, silicon, carbon, aluminum oxide and titanium oxide.

16. The method according to claim 1, wherein at least one carrier structure for the at least one sidewall structure comprises at least one of the group of silicon, single layer resist, bilayer resist, multilayer resist and carbon.

17. The method according to claim 1, wherein the sidewall structure is a spacer structure.

18. The method according to claim 17, wherein the spacer structure is a sublithographic structure.

19. The method according to claim 17, wherein the spacer structure has a width between 5 nm and 50 nm.

20. The method according to claim 1, wherein the sidewall structure is manufactured by a spacer technique comprising a line-by-spacer technique, a pattern-by-spacer technique, a line-by-fill technique, a pattern-by-fill technique, a liner-fill or a pattern-fill technique.

21. The method according to claim 1, wherein the mask layer comprises at least one layer selected from the group consisting of a hard mask layer, a silicon layer, a silicon oxynitride layer, an oxide layer, a nitride layer, a carbon layer, and an $Al_2O_3$ layer.

22. A method of manufacturing a structure on or in a substrate, the method comprising:
   positioning at least one spacer structure by a spacer technique on the substrate;
   using the at least one spacer structure as a mask for at least one subsequent implantation step for generating at least one latent image in the substrate;
   removing the at least one spacer structure;
   after removing the at least one spacer structure forming a pattern not including a spacer structure using a cut mask, wherein the pattern at least partially covers the area with the latent image;
   at least partially etching areas not covered with the pattern; and
   removing the pattern at least partially.

23. A method of manufacturing a structure on or in a substrate, the method comprising:
   positioning at least one spacer structure by a spacer technique on the substrate;
   etching the substrate at least partially using the spacer structure as a mask;
   generating a latent image in the substrate using the structure generated with the spacer structure as the mask in a subsequent implantation step;
   removing the at least one spacer structure;
   after removing the at least one spacer structure forming a pattern not including a spacer structure using a cut mask, wherein the pattern at least partially covers the area with the latent image;
   etching at least partially areas not covered with the pattern;
   removing the pattern at least partially; and
   removing the implanted areas at least partially.

* * * * *